(12) United States Patent
Liu

(10) Patent No.: US 12,464,785 B2
(45) Date of Patent: Nov. 4, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Youming Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 464 days.

(21) Appl. No.: 18/152,776

(22) Filed: Jan. 11, 2023

(65) Prior Publication Data

US 2024/0038838 A1 Feb. 1, 2024

Related U.S. Application Data

(63) Continuation of application No. PCT/CN2022/116710, filed on Sep. 2, 2022.

(30) Foreign Application Priority Data

Aug. 1, 2022 (CN) .......................... 202210917665.3

(51) Int. Cl.
*H10D 62/10* (2025.01)
*H01L 21/762* (2006.01)

(52) U.S. Cl.
CPC ..... *H10D 62/115* (2025.01); *H01L 21/76205* (2013.01)

(58) Field of Classification Search
CPC ......... H01L 21/76224; H01L 21/76205; H01L 21/764; H01L 21/763; H01L 21/76847;

(Continued)

(56) References Cited

U.S. PATENT DOCUMENTS

2006/0170020 A1* 8/2006 Ohta ................. H01L 21/76877
257/295
2006/0246657 A1* 11/2006 Kim ...................... H10B 41/42
257/E21.546

(Continued)

FOREIGN PATENT DOCUMENTS

| CN | 108461496 A | 8/2018 |
|----|-------------|--------|
| CN | 110970345 A | 4/2020 |

(Continued)

OTHER PUBLICATIONS

ISA State Intellectual Property Office of the People's Republic of China, International Search Report Issued in Application No. PCT/CN2022/116710 on Mar. 10, 2023 WIPO, 8 pages.

*Primary Examiner* — Mouloucoulaye Inoussa
(74) *Attorney, Agent, or Firm* — Kilpatrick Townsend & Stockton LLP

(57) ABSTRACT

Embodiments relates to a semiconductor structure and a method for fabricating the same. The method includes: providing a substrate, where an isolation trench is formed in the substrate; forming a first isolation layer in the isolation trench, where the first isolation layer fills the isolation trench, and a crack extending to an upper surface of the first isolation layer along a vertical direction is formed in the first isolation layer; removing part of the first isolation layer by etching back to form an isolation filling groove in communication with a top opening of the crack; and forming a second isolation layer in the isolation filling groove to plug the top opening of the crack, where the first isolation layer and the second isolation layer jointly constitute an isolation structure.

20 Claims, 7 Drawing Sheets

(58) Field of Classification Search
CPC ............... H01L 21/76877; H01L 21/50; H01L 21/76831; H01L 21/7682; H01L 21/76897; H01L 21/31055; H01L 21/32139; H10D 62/115; H10F 39/011; H10F 39/807; H10F 39/18; H10F 39/8063; H10F 39/8053; H10B 12/485; H10B 12/0335
See application file for complete search history.

(56) References Cited

U.S. PATENT DOCUMENTS

| | | | |
|---|---|---|---|
| 2007/0218684 A1* | 9/2007 | Kim | H10B 12/0335 257/E21.585 |
| 2016/0086985 A1* | 3/2016 | Chung | H10F 39/011 257/443 |
| 2021/0083075 A1* | 3/2021 | Li | H10D 48/01 |
| 2021/0104612 A1* | 4/2021 | Bae | H10D 30/6219 |
| 2022/0084881 A1* | 3/2022 | Zhu | H01L 23/5223 |
| 2022/0223597 A1* | 7/2022 | Gong | H10B 12/30 |
| 2022/0285204 A1* | 9/2022 | Lu | H01L 21/76847 |
| 2022/0320095 A1* | 10/2022 | Sheng | H01L 23/5222 |
| 2023/0006061 A1* | 1/2023 | Han | H10D 30/025 |
| 2024/0188306 A1* | 6/2024 | Wang | H10N 70/826 |

FOREIGN PATENT DOCUMENTS

| | | |
|---|---|---|
| KR | 20020055938 A | 7/2002 |
| KR | 20070021511 A | 2/2007 |
| WO | 2022033160 A1 | 2/2022 |

* cited by examiner

SEMICONDUCTOR STRUCTURE AND METHOD FOR FABRICATING SAME

CROSS REFERENCE TO RELATED APPLICATION

This application is a continuation of PCT/CN2022/116710, filed on Sep. 2, 2022, which claims priority to Chinese Patent Application No. 2022109176653, titled "SEMICONDUCTOR STRUCTURE AND METHOD FOR FABRICATING SAME" and filed on Aug. 1, 2022, the entire contents of which are incorporated herein by reference.

TECHNICAL FIELD

The present disclosure relates to the field of semiconductor technology, and more particularly, to a semiconductor structure and a method for fabricating the same.

BACKGROUND

When performing atomic layer deposition process on existing semiconductor structures, it is easy to form cracks in middle after film layers are filled in grooves because thicknesses of deposited bottoms and edges are kept consistent. The cracks are still exposed from surfaces after planarization and polishing processes are performed. When etching the semiconductor structure, etching solvents may enter the film layers along the cracks and cause etching on the film layers, resulting in serious bifurcation of the film layers.

SUMMARY

An objective of the present disclosure is to provide a semiconductor structure and a method for fabricating the same.

The method for fabricating the semiconductor structure provided by embodiments of the present disclosure includes: providing a substrate, where an isolation trench is formed in the substrate; forming a first isolation layer in the isolation trench, where the first isolation layer fills the isolation trench, and a crack extending to an upper surface of the first isolation layer along a vertical direction is formed in the first isolation layer; removing part of the first isolation layer by etching back to form an isolation filling groove in communication with a top opening of the crack; and forming a second isolation layer in the isolation filling groove to plug the top opening of the crack, where the first isolation layer and the second isolation layer jointly constitute an isolation structure.

The present disclosure also provides a semiconductor structure. The semiconductor structure according to the embodiments of the present disclosure includes: a substrate, where an isolation trench is formed in the substrate; and an isolation structure formed in the isolation trench, where the isolation structure fills the isolation trench. The isolation structure comprises a first isolation layer and a second isolation layer positioned on the first isolation layer, where a crack extending to an upper surface of the first isolation layer along a vertical direction is formed in the first isolation layer, and the second isolation layer is configured to plug a top opening of the crack.

BRIEF DESCRIPTION OF THE DRAWINGS

FIGS. 3 to 9 and FIGS. 14 to 16 are schematic structural diagrams of steps of a method for fabricating a semiconductor structure according to another embodiment of the present disclosure.

REFERENCE NUMERALS IN THE ACCOMPANYING DRAWINGS

100: semiconductor structure;
1: substrate, 11: isolation trench, 12: isolation filling groove;
2: isolation structure, 21: first isolation layer, 211: first initial isolation layer, 22: second isolation layer, 221: second initial isolation layer, 23: crack, 231: top opening, 24: gap, 25: third isolation layer;
3. active pillar structure;
4: sacrificial layer;
51: gate structure, 511: gate initial structure, 512: gate oxide layer, 513: gate layer, 52: gate groove, 53: isolation opening; and
6: bit line structure.

DETAILED DESCRIPTION

A method for fabricating a semiconductor structure 100 provided by the present disclosure is described in further detail below with reference to the accompanying drawings and embodiments.

Figure 1:
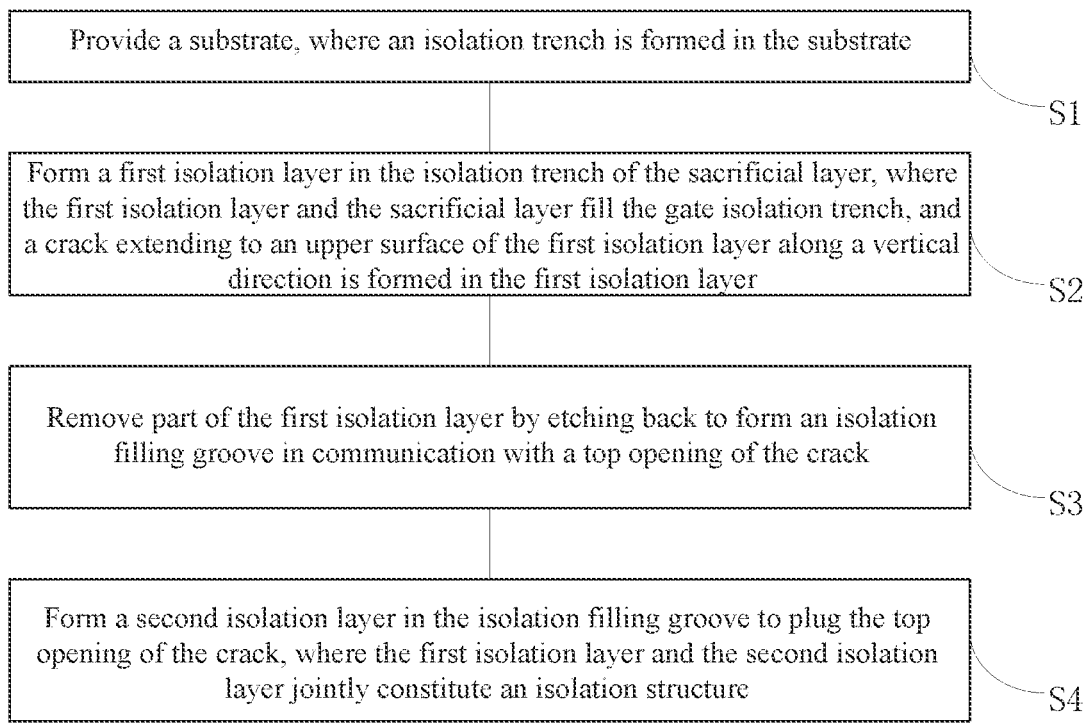
FIG. 1 is a flowchart of a method for fabricating a semiconductor structure according to an embodiment of the present disclosure.

The method for fabricating the semiconductor structure 100 according to the embodiments of the present disclosure is described below with reference to the accompanying drawings. FIG. 1 shows a flowchart of the method for fabricating the semiconductor structure 100 according to the embodiments of the present disclosure.

As shown in FIG. 1, the method for fabricating the semiconductor structure 100 according to the embodiments of the present disclosure may include: providing a substrate 1, where an isolation trench 11 is formed in the substrate 1; forming a first isolation layer 21 in the isolation trench 11, where the first isolation layer 21 fills the isolation trench 11, and a crack 23 extending to an upper surface of the first isolation layer 21 along a vertical direction is formed in the first isolation layer 21; removing part of the first isolation layer 21 by etching back to form an isolation filling groove 12 in communication with a top opening 231 of the crack 23; and forming a second isolation layer 22 in the isolation filling groove 12 to plug the top opening 231 of the crack 23, where the first isolation layer 21 and the second isolation layer 22 jointly constitute an isolation structure 2.

The method for fabricating the semiconductor structure 100 according to the embodiments of the present disclosure is described below with reference to FIGS. 2 to 16, where FIGS. 3 to 13 are cross-sectional views along an a-a line in FIG. 2 in structures of each step of the method for fabricating the semiconductor structure 100 according to one example of the present disclosure, and FIGS. 3 to 9 and FIGS. 14 to 16 are cross-sectional views along the a-a line in FIG. 2 in the structures of each step of the method for fabricating the semiconductor structure 100 according to one example of the present disclosure.

Figure 2:
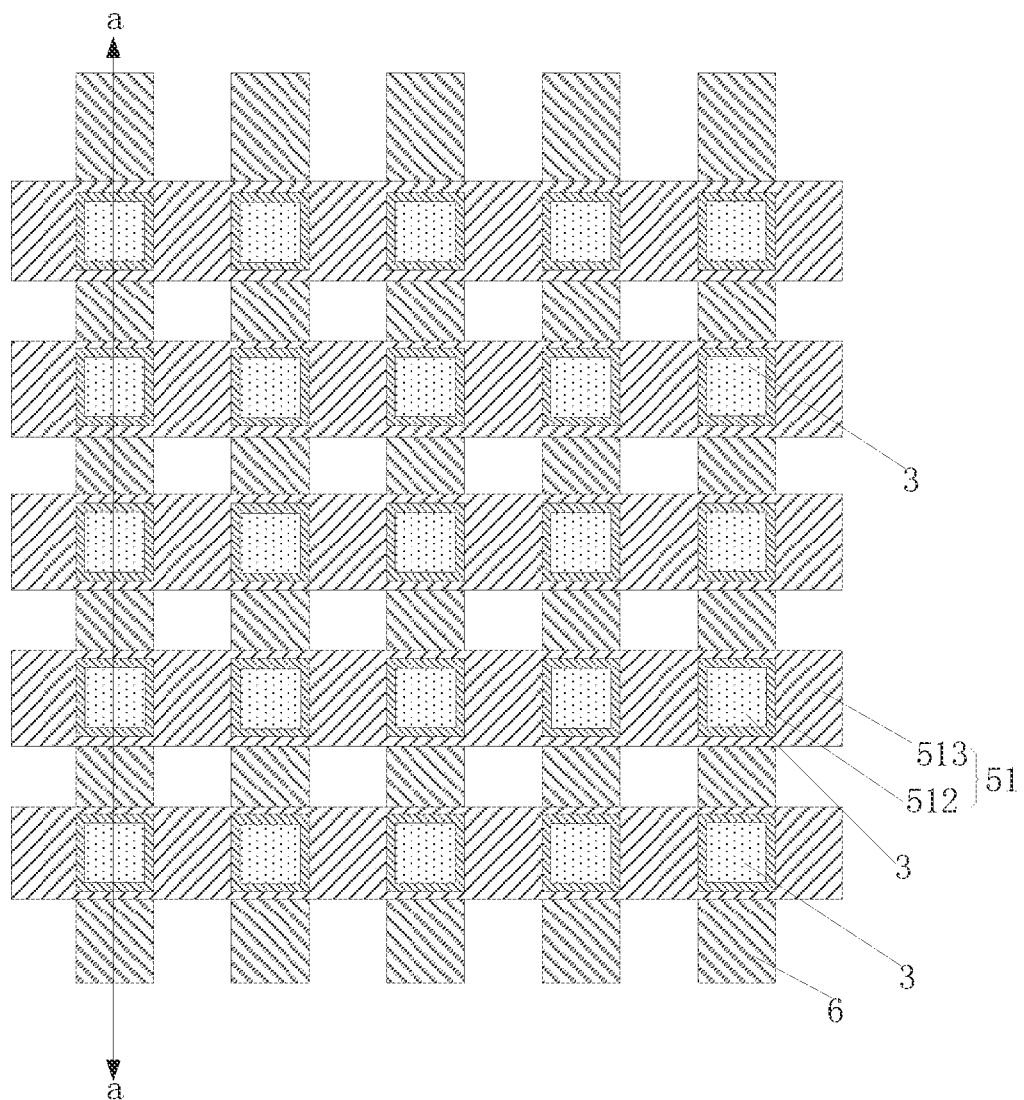
FIG. 2 is a top cross sectional view showing a partial structure of a semiconductor structure according to an embodiment of the present disclosure.
Figure 3:
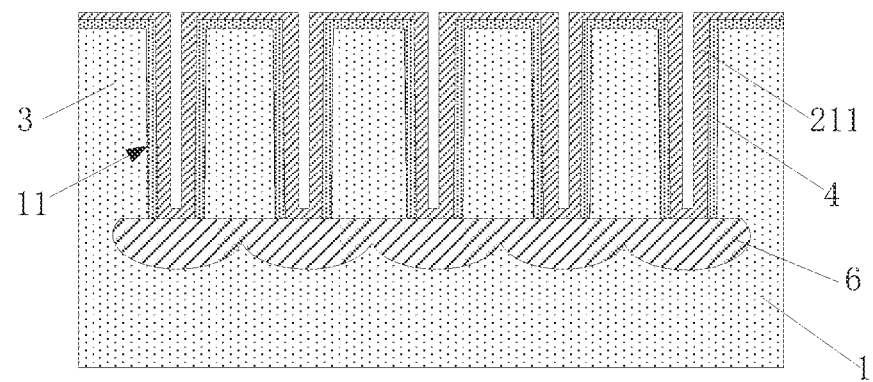
FIGS. 3 to 13 are schematic structural diagrams of steps of a method for fabricating a semiconductor structure according to one embodiment of the present disclosure.
Figure 4:
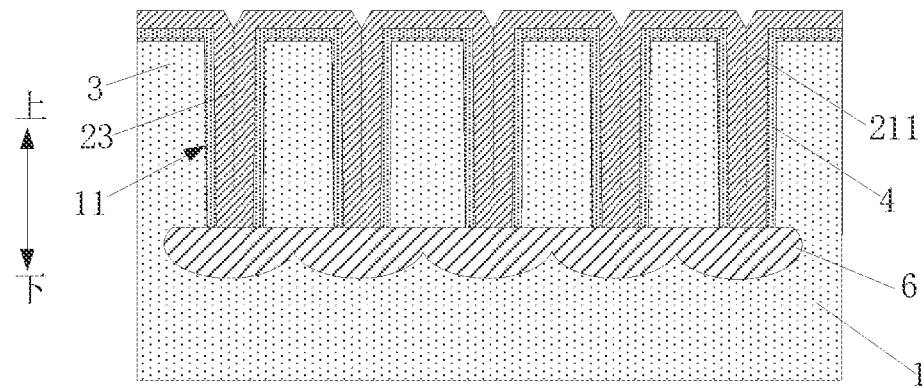

Referring to FIG. 2 to FIG. 4, in Step S1, there is provided a substrate 1, in which an isolation trench 11 is formed. In some embodiments, the substrate 1 may be, but is not limited to, a silicon substrate. This embodiment is described by taking an example where the substrate 1 is the silicon substrate. In some other embodiments, the substrate also may be a semiconductor substrate such as gallium nitride, gallium arsenide, gallium carbide, silicon carbide, or silicon on insulator (SOI). The substrate 1 is configured to support device structures thereon. The isolation trench 11 may be formed in the substrate 1 by means of wet etching or dry etching. There may be a plurality of isolation trenches 11 spaced apart, where the isolation trenches 11 may be configured to form a shallow trench isolation (STI) structure, and the isolation trenches 11 may also be used in a gate-all-around transistor structure to form a gate structure 51 of the gate-all-around transistor structure and a gate isolation structure. In some embodiments, other device structures may also be formed in the substrate 1. For example, a bit line structure 6 may be formed within the substrate 1, and the isolation trench 11 is positioned above the bit line structure 6 to form a word line structure and a word line isolation structure.

Figure 5:
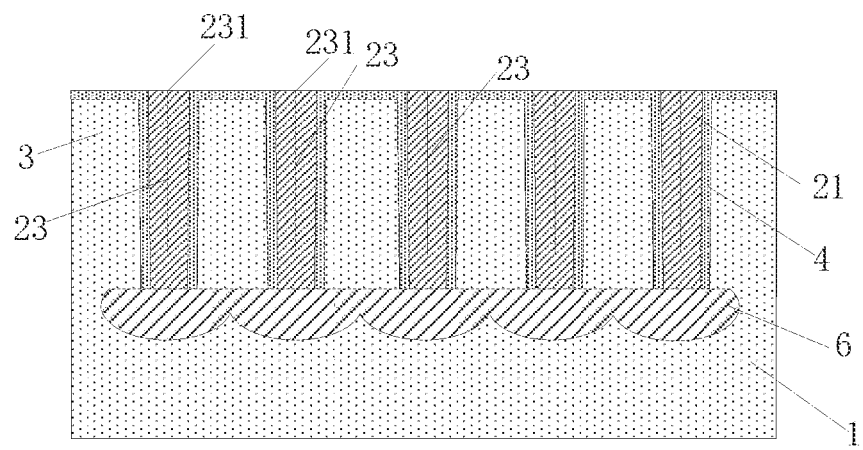

As shown in FIGS. 3 to 5, in Step S2, a first isolation layer 21 is formed in the isolation trench 11, where the first isolation layer 21 fills the isolation trench 11, and a crack 23 extending to an upper surface of the first isolation layer 21 along a vertical direction is formed in the first isolation layer 21.

In some embodiments, the first isolation layer 21 may be deposited within the isolation trench 11 by means of an atomic deposition process, where the first isolation layer 21 fills the isolation trench 11, as shown in FIG. 3 and FIG. 4. In the process of depositing and forming the first isolation layer 21, deposited thicknesses of deposited film layers are uniform on a surface of the substrate 1, a side wall and a bottom wall of the isolation trench 11. With the increasing thicknesses of the film layers, inevitably, the crack 23 may be formed in a middle of the first isolation layer, The crack 23 extends along a vertical direction (i.e., an up-down direction as shown in FIG. 4) to the upper surface of the first isolation layer 21. That is, the crack 23 extends to the upper surface of the first isolation layer 21, and an opening is formed on the upper surface of the first isolation layer 21, such that when an etching process is subsequently performed, an etchant may enter the crack 23 along the opening to etch the first isolation layer 21, thereby causing the first isolation layer 21 to easily generate serious bifurcation.

Figure 6:
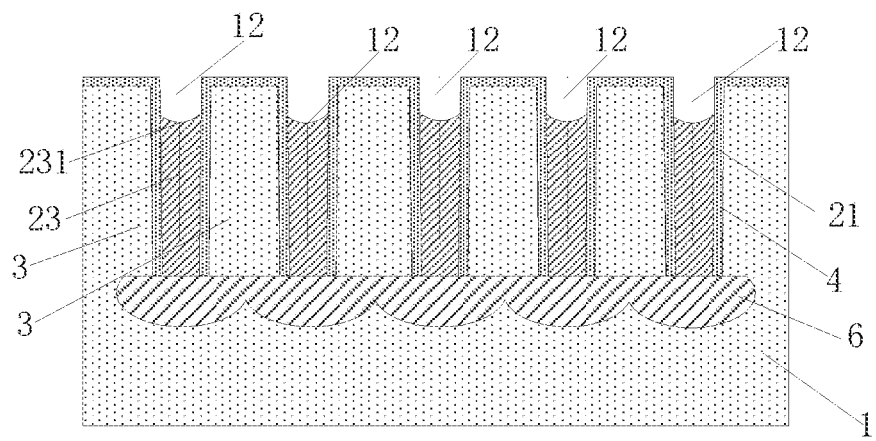

Next, as shown in FIG. 6, Step S3 is executed: part of the first isolation layer 21 is removed by etching back to form an isolation filling groove 12 in communication with a top opening 231 of the crack 23. By removing part of the first isolation layer 21 forming the crack 23 to reduce a length of the crack 23 in the vertical direction, the opening on the upper surface of the first isolation layer 21 is moved down, and the isolation filling groove 12 may be formed in the isolation trench 11, where the top opening 231 of the crack 23 communicates with the isolation filling groove 12.

Figure 7:
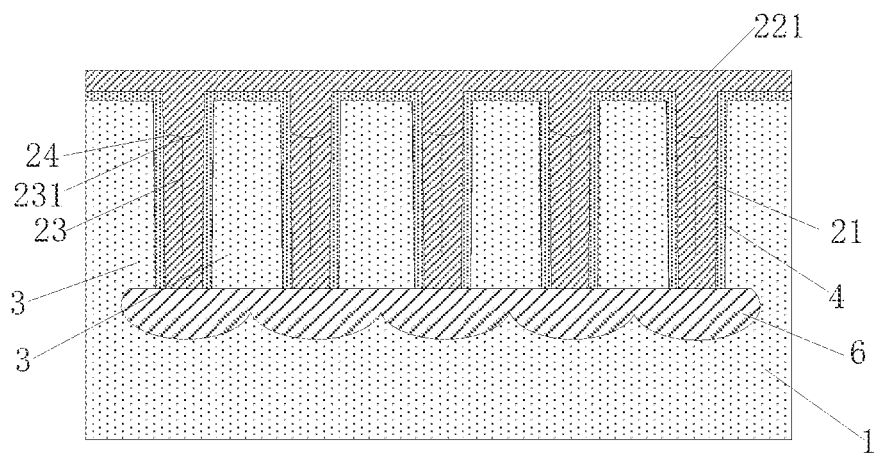
Figure 8:
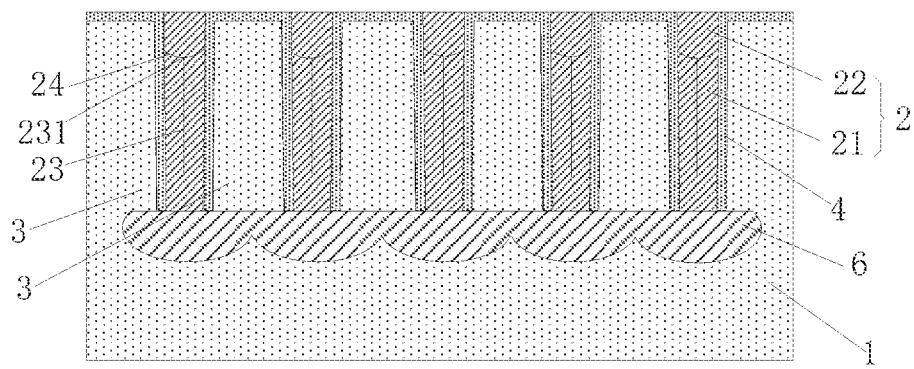
Figure 9:
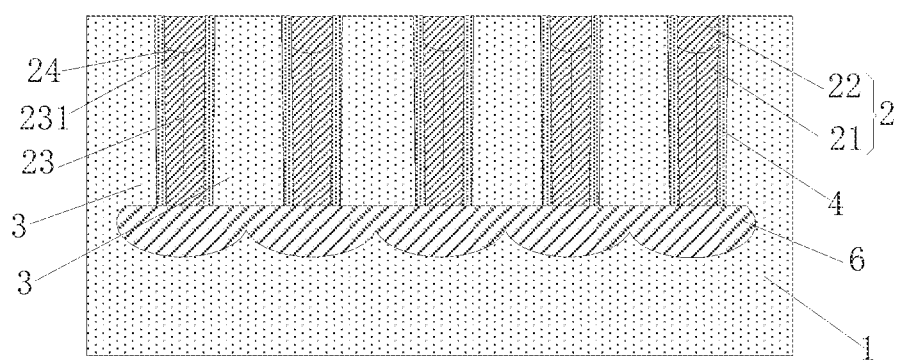

Next, as shown in FIG. 7 and FIG. 8, Step S4 is executed: a second isolation layer 22 is formed in the isolation filling groove 12 to plug the top opening 231 of the crack 23, where the first isolation layer 21 and the second isolation layer 22 jointly constitute the isolation structure 2. In this way, the second isolation layer 22 fills the isolation filling groove 12 and is formed above the crack 23, such that the top opening 231 of the crack 23 can be plugged, and thus the top opening 231 of the crack 23 may be prevented from extending to the top of the substrate 1 and adversely affecting subsequent etching. The first isolation layer 21 and the second isolation layer 22 may fill the isolation trench 11 to jointly constitute the isolation structure 2. In some embodiments, for the material of the isolation structure 2, both the first isolation layer 21 and the second isolation layer 22 may be silicon nitride layers or silicon oxynitride layers.

In the method for fabricating the semiconductor structure 100 according to the embodiments of the present disclosure, the first isolation layer 21 is etched back, and the second isolation layer 22 is formed in the isolation filling groove 12 formed after the first isolation layer 21 is etched back, where the second isolation layer 22 plugs the top opening 231 of the crack 23. In this way, it may prevent the etchant from entering the crack 23 through the top opening 231 and etching the isolation structure 2 during subsequent etching, thereby preventing the isolation structure 2 from generating bifurcation and adversely affecting performance of the semiconductor structure 100.

In some embodiments of the present disclosure, as shown in conjunction with FIGS. 2 to 4, the isolation trench 11 separates a plurality of active pillar structures 3 arranged in an array. In some embodiments, a plurality of active pillar structures 3 may be separated and formed within the substrate 1 by means of the isolation trench 11, and the plurality of active pillar structures 3 are arranged in an array. In some examples, the isolation trench 11 may include a word line isolation trench that may be separated within the substrate 1 to form the plurality of active pillar structures 3. In the example shown in FIG. 3, a bit line structure 6 is formed within the substrate 1, where the isolation trench 11 is positioned above the bit line structure 6, and the isolation trench 11 may be formed into the word line isolation trench to form a word line gate structure 51 and a word line isolation structure.

As shown in FIG. 3 and FIG. 4, before the first isolation layer 21 is formed in the isolation trench 11, the method for fabricating the semiconductor structure 100 further includes following steps: forming a sacrificial layer 4 on the side wall of the active pillar structure 3; as shown in FIGS. 10 to 13, after forming the isolation structure 2, the method also includes: removing part of the sacrificial layer 4; and forming a gate structure 51 between the active pillar structure 3 and the isolation structure 2, where the gate structure 51 at least surrounds part of the active pillar structure 3.

In some embodiments, as shown in FIGS. 3 to 9, the sacrificial layer 4 may be formed by means of at least one of physical vapor deposition, chemical vapor deposition and atomic layer deposition, where the sacrificial layer 4 is positioned on the side wall of the active pillar structure 3. In the example shown in FIG. 8, the sacrificial layer 4 may cover the side wall of the isolation trench 11 and the upper surface of the active pillar structure 3, and does not cover the bottom wall of the isolation trench 11 to expose the bit line structure 6 positioned at the bottom of the isolation trench 11. Next, the isolation structure 2 is formed on the surface of the sacrificial layer 4 and in the isolation trench 11, where the isolation structure 2 and the sacrificial layer 4 fill the isolation trench 11.

In some embodiments, a material of the sacrificial layer 4 may be silicon oxide, and materials of the first isolation layer 21 and the second isolation layer 22 may be silicon nitride, silicon carbide, or silicon carbonitride, etc. In some embodiments, the material of the sacrificial layer 4 may be silicon nitride, silicon carbide, or silicon carbonitride and the like, and the materials of the first isolation layer 21 and the second isolation layer 22 may be silicon oxide.

In some embodiments, as shown in FIG. 8, the isolation structure 2 may include a first isolation layer 21 and a second isolation layer 22, and the step of forming the first isolation layer 21 in the isolation trench 11 may include: forming a first initial isolation layer 211 on each of the plurality of active pillar structures 3, and on a bottom wall and a side wall of the isolation trench 11; and removing the first initial isolation layer 211 positioned on each of the plurality of active pillar structures 3 until an upper surface of the sacrificial layer 4 is exposed, where the first initial isolation layer 211 positioned in the isolation trench 11 is retained to form the first isolation layer 21.

In some embodiments, as shown in FIG. 3 and FIG. 4, an atomic layer deposition method may be employed to form the first initial isolation layer 211, which covers an upper surface of the active pillar structure 3 and a side wall and a bottom wall of the isolation trench 11. As shown in FIG. 5, part of the first initial isolation layer 211 positioned above the active pillar structure 3 is removed to expose the upper surface of the sacrificial layer 4, and the first initial isolation layer 211 positioned in the isolation trench 11 is retained to form the first isolation layer 21, where the crack 23 is formed in a middle position of the first isolation layer 21, and the top opening 231 of the crack 23 exposes the surface. In some embodiments, in this step, the first initial isolation layer 211 positioned on the upper surface of the sacrificial layer 4 may be planarized to remove part of the first initial isolation layer 211 until the sacrificial layer 4 is exposed. Further, part of the first initial isolation layer 211 may be removed by means of a chemical mechanical polishing process to form the first isolation layer 21.

As shown in FIG. 7, the step of forming the second isolation layer 22 on the first isolation layer 21 may include: forming a second initial isolation layer 221 on each of the plurality of active pillar structures 3 and a surface of the first isolation layer 21; and as shown in FIG. 8, removing part of the second initial isolation layer 221 positioned on each of the plurality of active pillar structures 3, where the second initial isolation layer 221 positioned on the first isolation layer 21 and within the isolation filling groove 12 is retained to form the second isolation layer 22.

In some embodiments, after part of the first isolation layer 21 is removed to form the isolation filling groove 12 in communication with the top opening 231 of the crack 23, as shown in FIG. 7, the second initial isolation layer 221 may be deposited and formed on the sacrificial layer 4 and in the isolation filling groove 12 by means of atomic layer deposition, where the second initial isolation layer 221 is formed above the active pillar structure 3 and on the surface of the first isolation layer 21, and fills the isolation filling groove 12. As shown in FIG. 8, part of the second initial isolation layer 221 positioned on the upper surface of the sacrificial layer 4 is removed to expose the sacrificial layer 4, and the second initial isolation layer 221 positioned in the isolation filling groove 12 is retained to backfill the isolation filling groove 12, to form the second isolation layer 22, where the second isolation layer 22 plugs the top opening 231 of the crack 23 to prevent the etchant from etching the isolation structure 2 along the crack 23 in the subsequent etching process. In some embodiments, a planarization process such as a chemical mechanical polishing process may be employed in this step to grind the second initial isolation layer 221 to be flush with the sacrificial layer 4. In the step of depositing and forming the second initial isolation layer 221, a crack may also be formed in the second initial isolation layer 221, where the crack is generally formed at an upper part of the second initial isolation layer 221 corresponding to the middle position of the isolation trench 11. The crack is ground off when part of the second initial isolation layer 221 on the sacrificial layer 4 is removed, while part of the second initial isolation layer 221 positioned in the isolation filling groove 12 without the crack is retained to form the second isolation layer 22.

In some embodiments of the present disclosure, a depth of the isolation trench 11 ranges from 100 nm to 200 nm; and in the step of removing part of the first isolation layer 21 by etching back, a thickness of the first isolation layer 21 etched back in the isolation filling groove 12 may be 5 nm to 30 nm. For example, the depth of the first isolation layer 21 removed may be 5 nm, 10 nm, 15 nm, 20 nm, 25 nm, or 30 nm, In this way, the thickness of the second isolation layer 22 which is subsequently formed to fill the isolation filling groove 12 may be 5 nm to 30 nm. Thus, it is convenient to etch back the first isolation layer 21 and prevent excessive or insufficient etch-back, it is also convenient to control the thickness of the second isolation layer 22 formed subsequently, to prevent that the thickness of the second isolation layer 22 is too small to plug the crack 23 or a plugging effect is poor. Furthermore, it also can prevent the formation of cracks in the second isolation layer 22 due to larger thickness of the second isolation layer 22 deposited subsequently.

In some embodiments of the present disclosure, as shown in FIGS. 3 to 16, a bit line structure 6 is formed in the substrate 1, and a bottom of the isolation trench 11 exposes the bit line structure 6, where the bit line structure 6 at least partially surrounds the active pillar structure 3. Further, the bit line structure 6 surrounds the side wall of the active pillar structure 3, and the isolation structure 2 is positioned in the isolation trench 11 and on the bit line structure 6.

In some embodiments of the present disclosure, as shown in FIG. 2, the step of forming a gate structure 51 between the active pillar structure 3 and the isolation structure 2 includes: forming a gate oxide layer 512 on the side wall of each of the plurality of active pillar structures 3; and forming a gate layer 513 on a surface of the gate oxide layer 512, where the gate layer 513 and the gate oxide layer 512 constitute the gate structure 51.

In some embodiments, after part of the sacrificial layer 4 is removed, a gate groove 52 at least surrounding part of the active pillar structure 3 may be formed between the active pillar structure 3 and the isolation structure 2, where part of the sacrificial layer 4 is retained between the gate trench 52 and the bit line structure 6 to isolate the bit line structure 6. Next, the gate oxide layer 512 is deposited and formed on the side wall of the active pillar structure 3 forming the gate trench 52, where the gate oxide layer 512 may at least partially surround the active pillar structure 3. Next, the gate layer 513 is formed on the surface of the gate oxide layer 512, where the gate layer 513 and the gate oxide layer 512 fill the gate trench 52 to form the gate structure 51 surrounding at least part of the active pillar structure 3. Further, the gate structure 51 may circle around the active pillar structure 3 by one trip.

In some embodiments of the present disclosure, as shown in FIGS. 10 to 11 and FIGS. 15 to 16, the method for fabricating the semiconductor structure 100 may further include: forming, above the gate structure 51, a third isolation layer 25 between each of the plurality of active pillar structures 3 and the isolation structure 2, where the third isolation layer 25 is positioned above the gate structure 51 to isolate the gate structure 51.

In some examples, the step of forming the third isolation layer 2 may include following steps.

Figure 10:
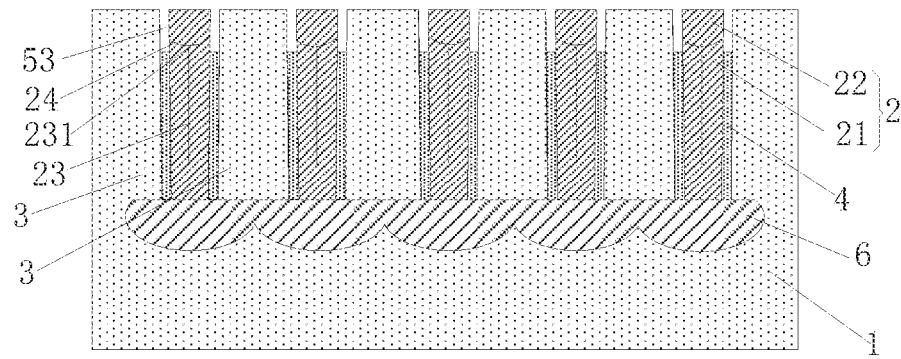
Figure 11:
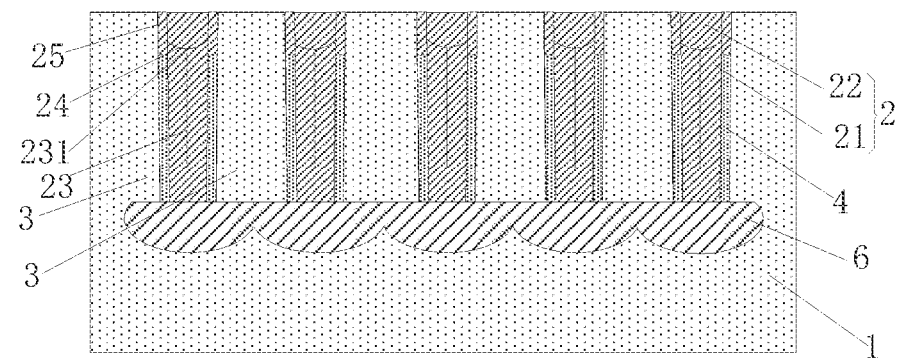
Figure 12:
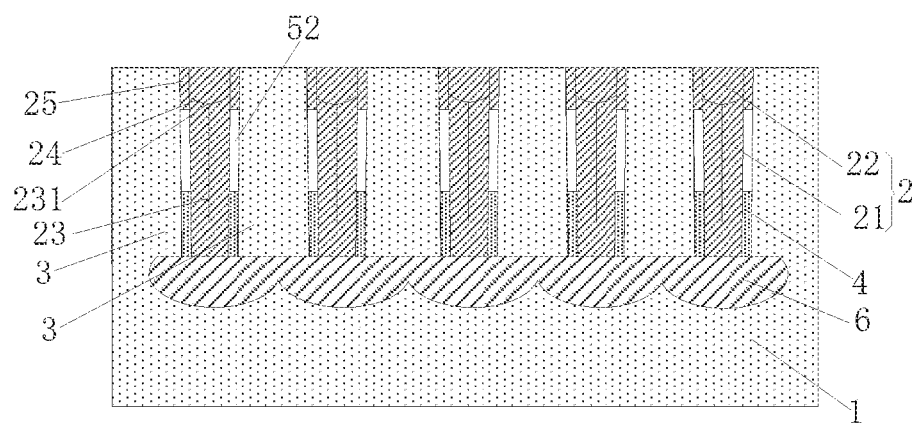
Figure 13:
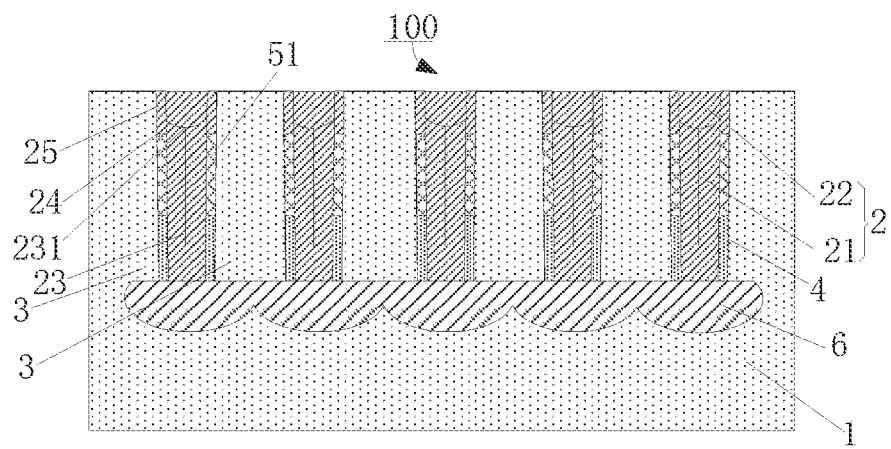

As shown in FIG. 10, after forming the isolation structure 2 and before forming the gate structure 51 between each of the plurality of active pillar structures 3 and the isolation structure 2, part of the sacrificial layer 4 is removed to form an isolation opening 53. In some embodiments, after the isolation structure 2 is formed, a planarization process may be performed on the sacrificial layer 4 and the second isolation layer 22, to remove the sacrificial layer 4 on the substrate 1 and part of the second isolation layer 22. Next, the sacrificial layer 4 is etched back, and part of the sacrificial layer 4 is retained, to form the isolation opening 53 at an upper part of the active pillar structure 3 and the isolation structure 2. Next, as shown in FIG. 11, a third isolation layer 25 is formed in the isolation opening 53, where the third isolation layer 25 fills the isolation opening 53. As shown in FIGS. 12 to 13, in the step of removing part of the sacrificial layer 4 to form the gate structure 51, part of the sacrificial layer 4 positioned below the third isolation layer 25 is removed to form the gate structure 51. In the step of forming the second isolation layer 22, a gap 24 may be formed at a position where the second isolation layer 22 contacts the first isolation layer 21. In the step of removing part of the sacrificial layer 4 to form the isolation opening 53, as shown in FIG. 10, the bottom wall of the isolation opening 53 is lower than a side opening of the gap 24 between the second isolation layer 22 and the first isolation layer 21. In this way, as shown in FIG. 11 and FIG. 12, the third isolation layer 25 is formed in the isolation opening 53 to plug the gap 24, thereby preventing the etchant from etching the isolation structure 2 along the gap 24 in the subsequent process of etching the sacrificial layer 4 to form the gate structure 51.

Figure 14:
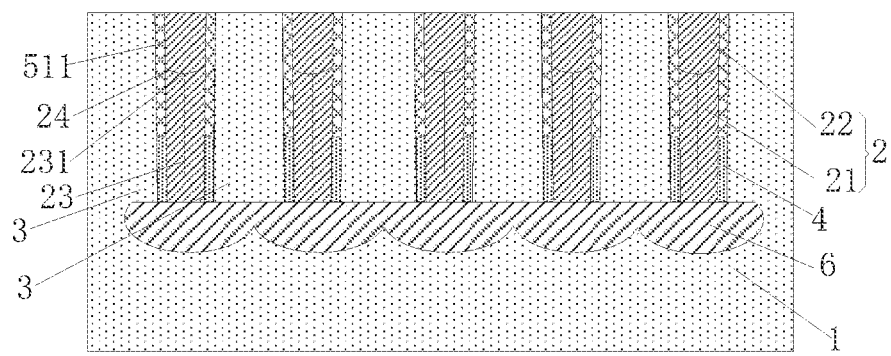
Figure 15:
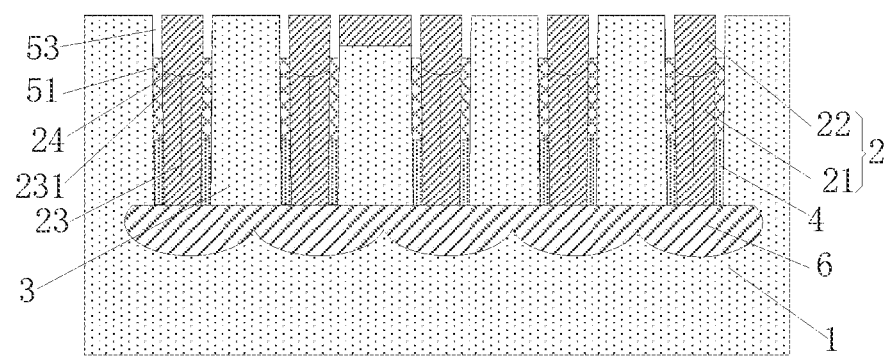
Figure 16:
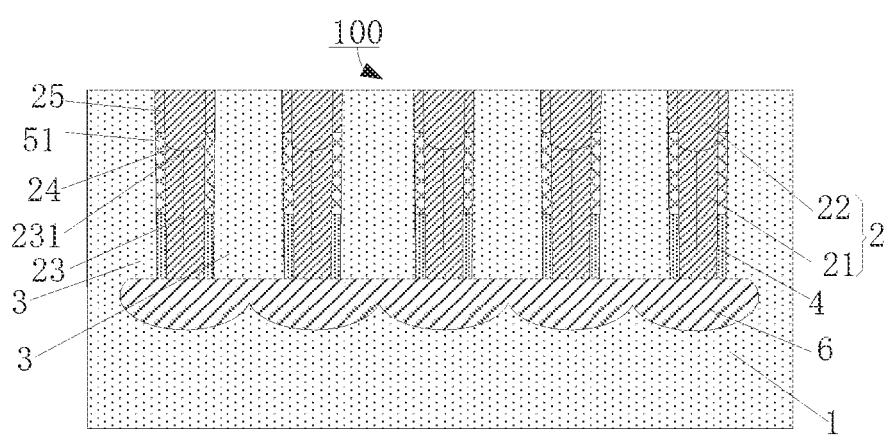

In some other examples of the present disclosure, as shown in FIGS. 14 to 16, the step of forming the third isolation layer 25 comprises: removing part of the sacrificial layer 4 after forming the isolation structure 2 and before forming the gate structure 51 between each of the plurality of active pillar structures 3 and the isolation structure 2. In some embodiments, after the isolation structure 2 is formed, a planarization process may be performed on the sacrificial layer 4 and the second isolation layer 22 to remove the sacrificial layer 4 on the substrate 1 and part of the second isolation layer 22. Next, the sacrificial layer 4 is etched back, and part of the sacrificial layer 4 at the bottom of the isolation trench 11 is retained, to form a gate opening on the upper part of the active pillar structure 3 and the isolation structure 2. Next, as shown in FIG. 14, a gate initial structure 511 is formed between the active pillar structure 3 and the isolation structure 2, where the gate initial structure 511 fills the gate opening, and at least partially surrounds the active pillar structure 3. As shown in FIG. 15, part of the gate initial structure 511 partially positioned at the upper part is removed to form the isolation opening 53, and part of the gate initial structure 511 is retained to form the gate structure 51. As shown in FIG. 16, the third isolation layer 25 is formed above the gate structure 51. That is, the third isolation layer 25 is formed in the isolation opening 53, where the third isolation layer 25 fills the isolation opening 53. In some embodiments, as shown in FIGS. 15 to 16, in the step of removing part of the gate initial structure 511, the height of the gate initial structure 511 removed is less than that of the second isolation layer 22. That is, the upper surface of the gate structure 51 is higher than the gap 24 at a contact position between the second isolation layer 22 and the first isolation layer 21. Thus, when part of the gate initial structure 51 is removed, a remaining part of the gate initial structure 511, i.e., the gate structure 51, can plug the gap 24 at the contact position between the first isolation layer 21 and the second isolation layer 22, to prevent the etchant from adversely affecting the gap 24 when the gate initial structure 511 is etched back.

The present disclosure also provides a semiconductor structure 100.

As shown in FIG. 13 and FIG. 16, the semiconductor structure 100 according to the embodiments of the present disclosure may include a substrate 1 and an isolation structure 2, where an isolation trench 11 is formed in the substrate 1, the isolation structure 2 is formed in the isolation trench 11, and the isolation structure 2 may be formed as a shallow trench isolation (STI) structure 2 between active areas. The isolation structure 2 may also be configured to form the gate structure 51 and the gate isolation structure 2 by means of subsequent etching or the like The substrate 1 may be, but is not limited to, a silicon substrate. This embodiment is described by taking an example where the substrate 1 is the silicon substrate. In some other embodiments, the substrate also may be a semiconductor substrate such as gallium nitride, gallium arsenide, gallium carbide, silicon carbide, or silicon on insulator (SOI). The substrate 1 is configured to support device structures thereon.

As shown in FIG. 13 and FIG. 16, the isolation structure 2 fills the isolation trench 11, where the isolation structure 2 may include a first isolation layer 21 and a second isolation layer 22 positioned on the first isolation layer 21. A crack 23 extending to an upper surface of the first isolation layer 21 along a vertical direction is formed in the first isolation layer 21, and the second isolation layer 22 plugs the top opening 231 of the crack 23. In some embodiments, both the first isolation layer 21 and the second isolation layer 22 may be formed by means of an atomic layer deposition process. In the process of depositing and forming the first isolation layer 21, with the continuous proceeding of deposition, a crack 23 may be generated in the middle of the first isolation layer 21, and the crack 23 extends to the surface of the first isolation layer 21, where an upper surface of the first isolation layer 21 is positioned in the isolation trench 11 and is lower than the upper surface of the side wall of the isolation trench 11, and the second isolation layer 22 is positioned on the first isolation layer 21 and plugs the top opening 231 of the crack 23. In this way, the etchant may be prevented from etching the isolation structure 2 along the crack 23 when an etching process is performed on the semiconductor structure 100.

In some embodiments of the present disclosure, the semiconductor structure 100 further includes a gate structure 51, and the isolation trench 11 separates a plurality of active pillar structures 3 arranged in an array, where the gate structure 51 is positioned between each of the plurality of active pillar structures 3 and the isolation structure 2, and the gate structure 51 at least surrounds part of each of the plurality of active pillar structures 3. In some embodiments, the isolation trench 11 is positioned in the substrate 1, the plurality of active pillar structures 3 arranged in the array are formed in the substrate 1 by means of the isolation trench 11, and the isolation structure 2 is positioned in the isolation trench 11. The gate structure 51 is formed between the isolation structure 2 and the active pillar structure 3, and surrounds the side wall of part of the active pillar structure 3. Further, the gate structure 51 may circle around the active pillar structure 3 by one trip. The semiconductor structure 100 may have better channel control because the channel is at least partially surrounded by the gate structure 51.

In some examples, the semiconductor structure 100 further includes a third isolation layer 25, which is positioned above the gate structure 51 and between the active pillar structure 3 and the isolation structure 2, where the gate structure 51 may be isolated by means of the third isolation layer 25 and the isolation structure 2.

In some embodiments, as shown in FIG. 13, a lower surface of the third isolation layer 25 may be lower than the gap 24 formed at the contact position between the second isolation layer 22 and the first isolation layer 21. In some embodiments, the sacrificial layer 4 may also be formed between the isolation structure 2 and the active pillar structure 3. Part of the sacrificial layer 4 is removed by etching to form the third isolation layer 25 and the gate structure 51, where a material of the third isolation layer 25 is different from a material of the sacrificial layer 4. In the process step of first forming the third isolation layer 25 and then forming the gate structure 51, the lower surface of the third isolation layer 25 is lower than the position of the gap 24, such that when the sacrificial layer 4 is subsequently etched to form the gate structure 51, the isolation structure 2 may be prevented from being etched by the etchant along the gap 24. As shown in FIG. 16, the lower surface of the third isolation layer 25 may also be higher than the gap 24 formed at the contact position between the second isolation layer 22 and the first isolation layer 21, such that the sacrificial layer 4 may be etched to form the gate initial structure 511. Next, part of the gate initial structure 511 is removed to form the third isolation layer 25. In the step of removing part of the gate initial structure 511, a retained part of the gate initial structure 511 may plug the gap 24, to prevent the etchant from etching the isolation structure 2 along the gap 24 when the third isolation layer 25 is subsequently formed by etching, such that the lower surface of the third isolation layer 25 formed is higher than the position of the gap 24.

The above merely are some embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for fabricating a semiconductor structure, comprising:
    providing a substrate, wherein an isolation trench is formed in the substrate, and the isolation trench separates a plurality of active pillar structures arranged in an array;
    forming a sacrificial layer on a side wall of each of the plurality of active pillar structures; forming a first isolation layer in the isolation trench, wherein the first isolation layer fills the isolation trench, and a crack extending to an upper surface of the first isolation layer along a vertical direction is formed in the first isolation layer;
    removing part of the first isolation layer by etching back to form an isolation filling groove in communication with a top opening of the crack; and
    forming a second isolation layer in the isolation filling groove to plug the top opening of the crack, wherein the first isolation layer and the second isolation layer jointly constitute an isolation structure;
    removing part of the sacrificial layer; and
    forming a gate structure between each of the plurality of active pillar structures and the isolation structure, wherein the gate structure at least surrounds part of each of the plurality of active pillar structures.

2. The method for fabricating the semiconductor structure according to claim 1, wherein
    the forming the first isolation layer in the isolation trench comprises:
    forming a first initial isolation layer on each of the plurality of active pillar structures, and on a bottom wall and a side wall of the isolation trench; and
    removing the first initial isolation layer positioned on each of the plurality of active pillar structures until an upper surface of the sacrificial layer is exposed, wherein the first initial isolation layer positioned in the isolation trench is retained to form the first isolation layer.

3. The method for fabricating the semiconductor structure according to claim 2, wherein
    the removing the first initial isolation layer positioned on each of the plurality of active pillar structures comprises:
    planarizing the first initial isolation layer to remove part of the first initial isolation layer until the sacrificial layer is exposed.

4. The method for fabricating the semiconductor structure according to claim 3, wherein
    part of the first initial isolation layer is removed by means of a chemical mechanical polishing process to form the first isolation layer.

5. The method for fabricating the semiconductor structure according to claim 1, wherein
    a depth of the isolation trench ranges from 100 nm to 200 nm;
    and in the removing part of the first isolation layer by etching back, a depth of the first isolation layer removed ranges from 5 nm to 30 nm.

6. The method for fabricating the semiconductor structure according to claim 1, wherein
    the forming the second isolation layer on the first isolation layer comprises:
    forming a second initial isolation layer on each of the plurality of active pillar structures and a surface of the first isolation layer; and
    removing part of the second initial isolation layer positioned on each of the plurality of active pillar structures, wherein the second initial isolation layer positioned on the first isolation layer and within the isolation filling groove is retained to form the second isolation layer.

7. The method for fabricating the semiconductor structure according to claim 1, wherein
    the first isolation layer and the second isolation layer are deposited by means of an atomic layer deposition process.

8. The method for fabricating the semiconductor structure according to claim 1, wherein
    a material of the sacrificial layer is silicon oxide, and materials of the first isolation layer and the second isolation layer are silicon nitride.

9. The method for fabricating the semiconductor structure according to claim 1, wherein
    a bit line structure is formed in the substrate, and a bottom of the isolation trench exposes the bit line structure.

10. The method for fabricating the semiconductor structure according to claim 1, wherein
    the forming the gate structure between each of the plurality of active pillar structures and the isolation structure comprises:
    forming a gate oxide layer on the side wall of each of the plurality of active pillar structures; and forming a gate layer on a surface of the gate oxide layer, wherein the gate layer and the gate oxide layer constitute the gate structure.

11. The method for fabricating the semiconductor structure according to claim 1, further comprising:
   forming, above the gate structure, a third isolation layer between each of the plurality of active pillar structures and the isolation structure.

12. The method for fabricating the semiconductor structure according to claim 11, wherein
   the forming the third isolation layer comprises: after forming the isolation structure and before forming the gate structure between each of the plurality of active pillar structures and the isolation structure, removing part of the sacrificial layer to form an isolation opening; forming a third isolation layer in the isolation opening; and in the removing part of the sacrificial layer to form the gate structure, removing part of the sacrificial layer positioned below the third isolation layer.

13. The method for fabricating the semiconductor structure according to claim 11, wherein
   the forming the third isolation layer comprises: removing part of the sacrificial layer after forming the isolation structure and before forming the gate structure between each of the plurality of active pillar structures and the isolation structure; forming a gate initial structure between each of the plurality of active pillar structures and the isolation structure;
   and removing part of the gate initial structure positioned on an upper part, and forming a third isolation layer above the gate structure, wherein part of the gate initial structure is retained to form the gate structure.

14. A semiconductor structure, comprising:
   a substrate, wherein an isolation trench is formed in the substrate; and
   an isolation structure formed in the isolation trench, the isolation structure filling the isolation trench; wherein the isolation structure comprises a first isolation layer and a second isolation layer positioned on the first isolation layer; a crack extending to an upper surface of the first isolation layer along a vertical direction is formed in the first isolation layer; and the second isolation layer is configured to plug a top opening of the crack;
   a gate structure, the isolation trench separating a plurality of active pillar structures arranged in an array, wherein the gate structure is positioned between each of the plurality of active pillar structures and the isolation structure, and the gate structure at least surrounds part of each of the plurality of active pillar structures; and
   a third isolation layer, wherein the third isolation layer is positioned above the gate structure and between each of the plurality of active pillar structures and the isolation structure.

15. A method for fabricating a semiconductor structure, comprising:
   providing a substrate, wherein an isolation trench is formed in the substrate;
   forming a first isolation layer in the isolation trench, wherein the first isolation layer fills the isolation trench, and a crack extending to an upper surface of the first isolation layer along a vertical direction is formed in the first isolation layer;
   removing part of the first isolation layer by etching back to form an isolation filling groove in communication with a top opening of the crack; and
   forming a second isolation layer in the isolation filling groove to plug the top opening of the crack, wherein the first isolation layer and the second isolation layer jointly constitute an isolation structure;
   wherein a depth of the isolation trench ranges from 100 nm to 200 nm;
   and in the removing part of the first isolation layer by etching back, a depth of the first isolation layer removed ranges from 5 nm to 30 nm.

16. The method for fabricating the semiconductor structure according to claim 15, wherein
   a bit line structure is formed in the substrate, and a bottom of the isolation trench exposes the bit line structure.

17. The method for fabricating the semiconductor structure according to claim 15, wherein
   the first isolation layer and the second isolation layer are deposited by means of an atomic layer deposition process.

18. The semiconductor structure according to claim 14, further comprising
   a bit line structure formed in the substrate, wherein the bit line structure positioned below and in contact with the active pillar structure.

19. The semiconductor structure according to claim 14, wherein,
   the third isolation layer in contact with the gate structure, and a contact position between the third isolation layer and the gate structure lower than a contact position between the second isolation layer and the first isolation layer.

20. The semiconductor structure according to claim 14, wherein,
   the third isolation layer in contact with the gate structure, and a contact position between the third isolation layer and the gate structure high than a contact position between the second isolation layer and the first isolation layer.

* * * * *